(12) United States Patent
Barthel

(10) Patent No.: US 11,209,912 B2
(45) Date of Patent: Dec. 28, 2021

(54) MEASURING DEVICE AND CONFIGURATION METHOD

(71) Applicant: Rohde & Schwarz GmbH & Co. KG, Munich (DE)

(72) Inventor: Sven Barthel, Chemnitz (DE)

(*) Notice: Subject to any disclaimer, the term of this patent is extended or adjusted under 35 U.S.C. 154(b) by 95 days.

(21) Appl. No.: 15/371,136

(22) Filed: Dec. 6, 2016

(65) Prior Publication Data

US 2018/0157383 A1   Jun. 7, 2018

(51) Int. Cl.
| | | |
|---|---|---|
| *G06F 3/023* | (2006.01) | |
| *G06F 3/0488* | (2013.01) | |
| *G06F 9/451* | (2018.01) | |
| *G01R 13/40* | (2006.01) | |
| *G01R 13/00* | (2006.01) | |
| *G01R 13/02* | (2006.01) | |

(52) U.S. Cl.
CPC ........ *G06F 3/0238* (2013.01); *G06F 3/04886* (2013.01); *G06F 9/451* (2018.02); *G01R 13/00* (2013.01); *G01R 13/02* (2013.01); *G01R 13/403* (2013.01)

(58) Field of Classification Search
CPC ....... G06F 3/0482; G06F 3/048–04897; G01R 13/403; G01R 13/00; G01R 13/02
See application file for complete search history.

(56) References Cited

U.S. PATENT DOCUMENTS

| | | | | |
|---|---|---|---|---|
| 6,697,754 | B1* | 2/2004 | Alexander | G01R 13/22 |
| | | | | 702/119 |
| 2002/0130803 | A1* | 9/2002 | Conway | G08C 17/02 |
| | | | | 341/176 |
| 2010/0315366 | A1* | 12/2010 | Lee | G06F 3/0486 |
| | | | | 345/173 |
| 2011/0209093 | A1* | 8/2011 | Hinckley | G06F 3/04817 |
| | | | | 715/834 |
| 2012/0159366 | A1 | 6/2012 | Klein et al. | |
| 2012/0266480 | A1* | 10/2012 | Stephens | F42D 1/00 |
| | | | | 33/732 |
| 2013/0033525 | A1* | 2/2013 | Markiewicz | G06F 3/04883 |
| | | | | 345/684 |
| 2015/0242109 | A1 | 8/2015 | Mussig et al. | |
| 2015/0277672 | A1* | 10/2015 | Wang | G06F 3/0482 |
| | | | | 715/811 |

FOREIGN PATENT DOCUMENTS

| | | |
|---|---|---|
| DE | 102010062661 A1 | 6/2012 |
| DE | 102014203346 A1 | 8/2015 |

\* cited by examiner

*Primary Examiner* — Keith D Bloomquist

(57) ABSTRACT

A measuring device comprises a user input device, which comprises a first number of first user inputs for a user of the measuring device, a shortcut input device, which comprises a second number of shortcut user inputs for the user, and an assignment device, which assigns a respective one of the first user inputs to a respective one of the shortcut user inputs based on a received user command.

20 Claims, 4 Drawing Sheets

MEASURING DEVICE AND CONFIGURATION METHOD

TECHNICAL FIELD

The present invention relates to a measuring device. The present invention further relates to a configuration method for such a measuring device.

BACKGROUND

Although applicable in principal to any system that provides a user with configuration options, the present invention and its underlying problem will be hereinafter described in combination with measuring devices, like e.g. oscilloscopes.

Modern measuring devices, like e.g. oscilloscopes or network testers, provide a plurality of measurement functions, which can be configured by a user. Such oscilloscopes can provide the user with a huge amount of options and configuration parameters. It can therefore be complex and time consuming to reach and activate certain functions.

Against this background, the problem addressed by the present invention is providing a simplified handling for a measuring device.

SUMMARY

The present invention solves this object by a measuring device with the features of claim 1 and a configuration method with the features of claim 13.

Accordingly it is provided:

A measuring device comprising a user input device, which comprises a first number of first user inputs for a user of the measuring device, a shortcut input device, which comprises a second number of shortcut user inputs for the user, and an assignment device, which assigns a respective one of the first user inputs to a respective one of the shortcut user inputs based on a received user command.

A configuration method for a measuring device, the method comprising providing a user input device, which comprises a first number of first user inputs for a user of the measuring device, providing a shortcut input device, which comprises a second number of shortcut user inputs for the user, and assigning a respective one of the first user inputs to a respective one of the shortcut user inputs based on a received user command.

The measuring device according to the present invention can comprise a plurality of different first user inputs. These first user inputs e.g. allow the user to access the functions of the measuring device or configure the measuring device for a respective measurement task.

With an increasing number of first user inputs the complexity of configuring or simply using the measuring device increases.

The present invention therefore provides the shortcut input device, which provides the user with shortcut user inputs and therefore allows the user to perform the functions of specific ones of the first user inputs via the shortcut user inputs. The first number of first user inputs will usually be larger than the second number of shortcut user inputs.

To provide the user with the flexibility to assign specific first user inputs to the single shortcut user inputs the present invention also provides the assignment device. The user can e.g. provide user or assignment commands to the assignment device, which specify a first user input and a shortcut user input. The assignment device will then assign the respective first user input to the respective shortcut user input. The measuring device will then behave as if the respective first user input was activated, when instead the respective shortcut user input is activated.

Based on the finding of the present invention, the user can therefore e.g. easily access functions he often needs and does not have to search for or navigate to the respective first user input every time he wants to use the respective user input.

Further embodiments of the present invention are subject of the further subclaims and of the following description, referring to the drawings.

In a possible embodiment, the user input device can comprise a screen device and the first user inputs can be provided via an on screen display on the screen device. An on screen display allows to provide the user with a plurality of different user inputs without occupying a lot of space on e.g. the front panel of the measuring device. The on screen display can e.g. be displayed as an overlay, when a user provides a respective input e.g. with a dedicated hardware input or on the screen device, if it is a touch screen. Navigating the menu can e.g. be performed by dedicated buttons provided on the measuring device or via the touchscreen if the screen is a touch screen.

In a possible embodiment, the on screen display can comprise at least one navigation level and each level can comprise at least one of the first user inputs and/or at least one subordinate navigation level. Navigation levels serve to group certain functions or user inputs. Further every navigation level can also comprise subordinate navigation levels. Comprise in this context can mean that a link to another navigation level is present in a navigation level.

In a possible embodiment, the user input device can comprise a hardware device, which comprises a plurality of discrete input devices. The discrete input devices can e.g. comprise switches and/or buttons and/or rotary encoders. When actuated by the user, these discrete input devices can provide the first user inputs.

In a possible embodiment, the shortcut input device can comprise a hardware device, which comprises a plurality of discrete input devices, like e.g. switches and/or buttons and/or rotary encoders. If the shortcut input device is provided as a hardware device, e.g. buttons or other discrete input devices can be positioned in prominent places e.g. of the front plate of the measuring device. For example a row of buttons can be provided around a square shaped screen of the measuring device.

In a possible embodiment, the shortcut input device can comprise a screen device, which is arranged next to at least one of the discrete input devices and displays an indication of the respective first user input, which is assigned to the respective discrete input device. This allows providing the user with an indication of the current function of the shortcut user inputs and adapting the indication to changing assignments easily.

In a possible embodiment, the shortcut input device can comprise a touchscreen device and the shortcut user inputs can be provided via an on screen display. The on screen display allows to provide the shortcut user inputs at a prominent position, e.g. at the top of the touchscreen device. Further, the on screen display can e.g. be provided as a sliding menu, which does not occupy a lot of space on the screen when retracted but can be extracted with a gesture on the touchscreen device or a push of a virtual or discrete button. The touchscreen device of the shortcut user inputs can e.g. be the touchscreen device of the menu for the first user inputs.

In a possible embodiment, when one of the shortcut user inputs is activated or selected by the user, the shortcut input device can activate the assigned first user input or the respective function. This means that the shortcut user inputs can serve as a redirection to the respective first user inputs, without the need for the user to explicitly navigate to the respective first user input.

In a possible embodiment, the assignment device can comprise an activation switch, which when pushed initiates the assignment of one of the first user inputs to one of the shortcut user inputs. The activation switch can e.g. be used in different configurations, i.e. different processes for the assignment of one of the first user inputs to one of the shortcut user inputs. For example, when the activation switch is pressed, the assignment device can use the first user input, which was the last to be activated before the activation switch was activated and assign it to the shortcut user input, which is pressed after the activation switch is pressed. In another possible configuration the activation switch may e.g. be activated first. After pressing the activation switch, the user may then activate the respective first user input or a series of first user inputs and then the respective shortcut user input.

In a possible embodiment, the activation switch can be provided as an icon on a touchscreen device of the measuring device. The activation switch can e.g. be displayed in one of the corners of the touchscreen device or as a menu option in a menu on the touchscreen device, which e.g. comprises the first user inputs. Further, the activation switch can e.g. be displayed as the first or last option in all navigation levels of the menu, which is displayed on the touchscreen device and e.g. comprises a first user inputs.

In a possible embodiment, the assignment device can comprise a motion detector, which initiates the assignment of one of the first user inputs to one of the shortcut user inputs, when it detects a drag gesture on a touchscreen device of the measuring device on one of the first user inputs. The motion detector allows automatically initiating an assignment, when a user starts a drag gesture. It is understood, that e.g. a distance threshold can be provided and the assignment is only initiated if the drag gesture is longer than the distance threshold.

In a possible embodiment, the assignment device can assign the first user input on which the drag gesture is detected to the one of the shortcut user inputs, on which the drag gesture ends. This provides a very simple method of assigning a first user input to one of the shortcut user inputs.

In a possible embodiment, the assignment device can assign a sequence of first user inputs to a single shortcut user input. The respective first user inputs can e.g. be actuated in the required sequence by the user after actuating the activation switch and the assignment device will assign the complete sequence to the first shortcut user input that is activated.

In a possible embodiment, the assignment device can create a new shortcut user input, when it detects a drag gesture on a touchscreen device of the measuring device on one of the first user inputs.

In a possible embodiment, the assignment device can remove the respective first user input, after assigning the first user input to one of the shortcut user inputs.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
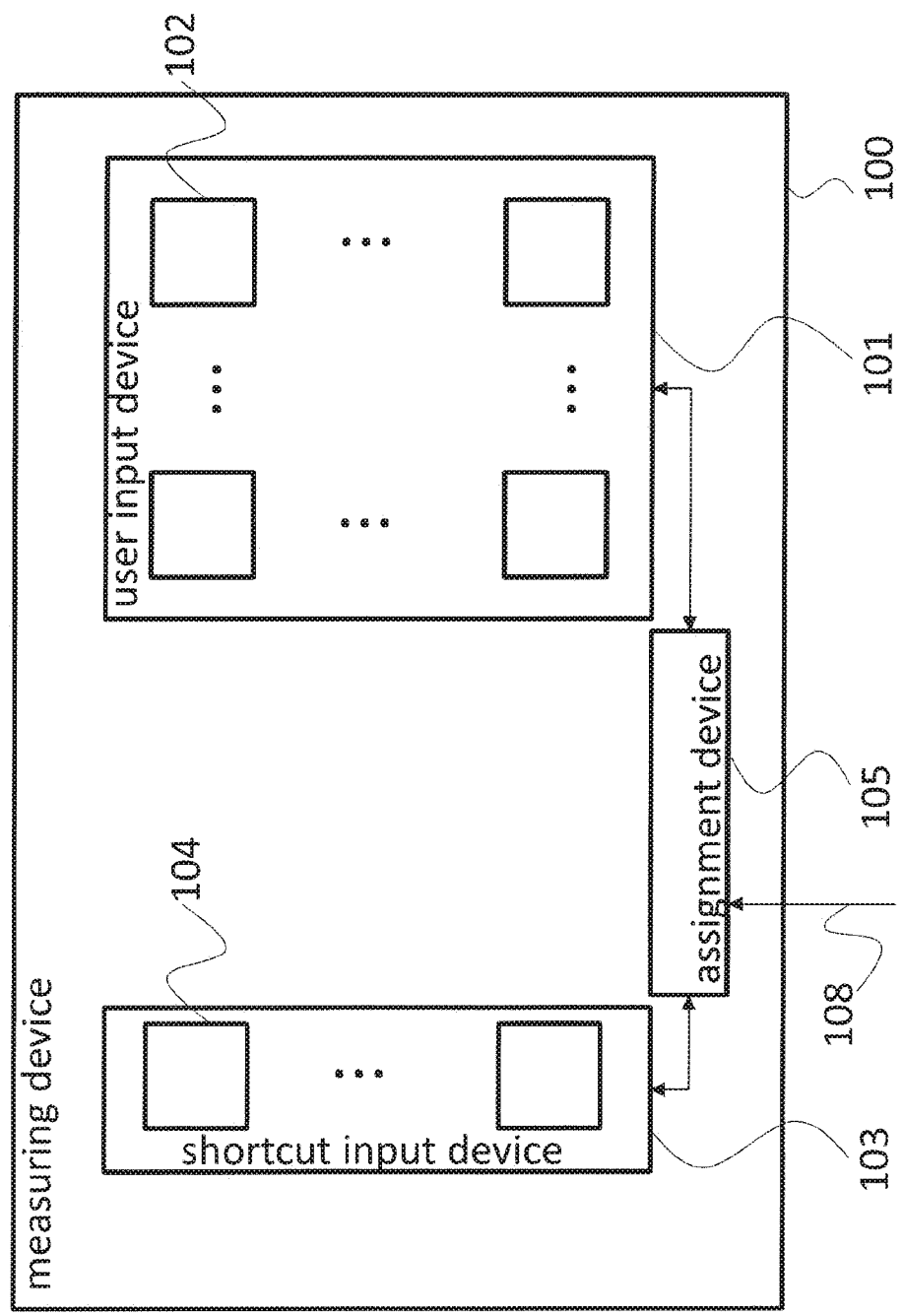
FIG. 1 shows a block diagram of an embodiment of a measuring device according to an embodiment of the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of a measuring device 100. The measuring device 100 comprises a user input device 101, which comprises a first number of first user inputs 102 for a user of the measuring device 100. In FIG. 1 four user inputs 102 are just exemplarily shown in the corners of the user input device 101 and further first user inputs 102 are hinted at by three dots. It is understood, that the measuring device 100 can have any number of first user inputs 102. The measuring device 100 further comprises a shortcut input device 103, which comprises a second number of shortcut user inputs 104 for the user. Only two shortcut user inputs 104 are exemplarily shown and further shortcut user inputs 104 are hinted at by three dots. It is understood, that the measuring device 100 can comprise any number of shortcut user inputs 104. Usually the number of shortcut user inputs 104 will be smaller than the number of first user inputs 102. For ease of understanding only one of the first user inputs 102 and the shortcut user inputs 104 are provided with a reference sign.

Finally, the measuring device 100 comprises an assignment device 105, which assigns a respective one of the first user inputs 102 to a respective one of the shortcut user inputs 104 based on a received user command 108. The term assigning refers to linking the first user input 102 and the shortcut user input 104 such that the function of the first user input 102 is performed when the shortcut user input 104 is actuated or activated by the user.

The first user inputs 102 and the shortcut user inputs 104 can e.g. comprise any type of input device, physical or virtual, e.g. displayed on a touch sensitive screen. Such input devices can e.g. comprise switches, buttons, knobs, rotary sensors, linear sensors or the like. The first user inputs 102 can refer to any input of the measuring device 100 or any function, which can be activated via one of the first user inputs 102.

The assignment device 105 can be implemented as a dedicated device, which is provided in the measuring device 100 and connected to the first user inputs 102 and the shortcut user inputs 104. However, the assignment device 105 can also be implemented as component or part of another entity in the measuring device 100, e.g. a processor (not explicitly shown) of the measuring device 100. In that embodiment, the assignment device 105 can e.g. be implemented as a software or as program instructions, which are executed by the processor.

The assignment of one of the first user inputs 102 to one of the shortcut user inputs 104 can e.g. be initiated when the assignment device 105 recognizes a long push of one of the shortcut user inputs 104. "Long" in this context can be a predefined amount of time, like e.g. 1 s, 2 s, 3 s, 4, or the like. As an alternative or in addition a dedicated activation switch can be provided (see e.g. FIG. 3).

Figure 2:
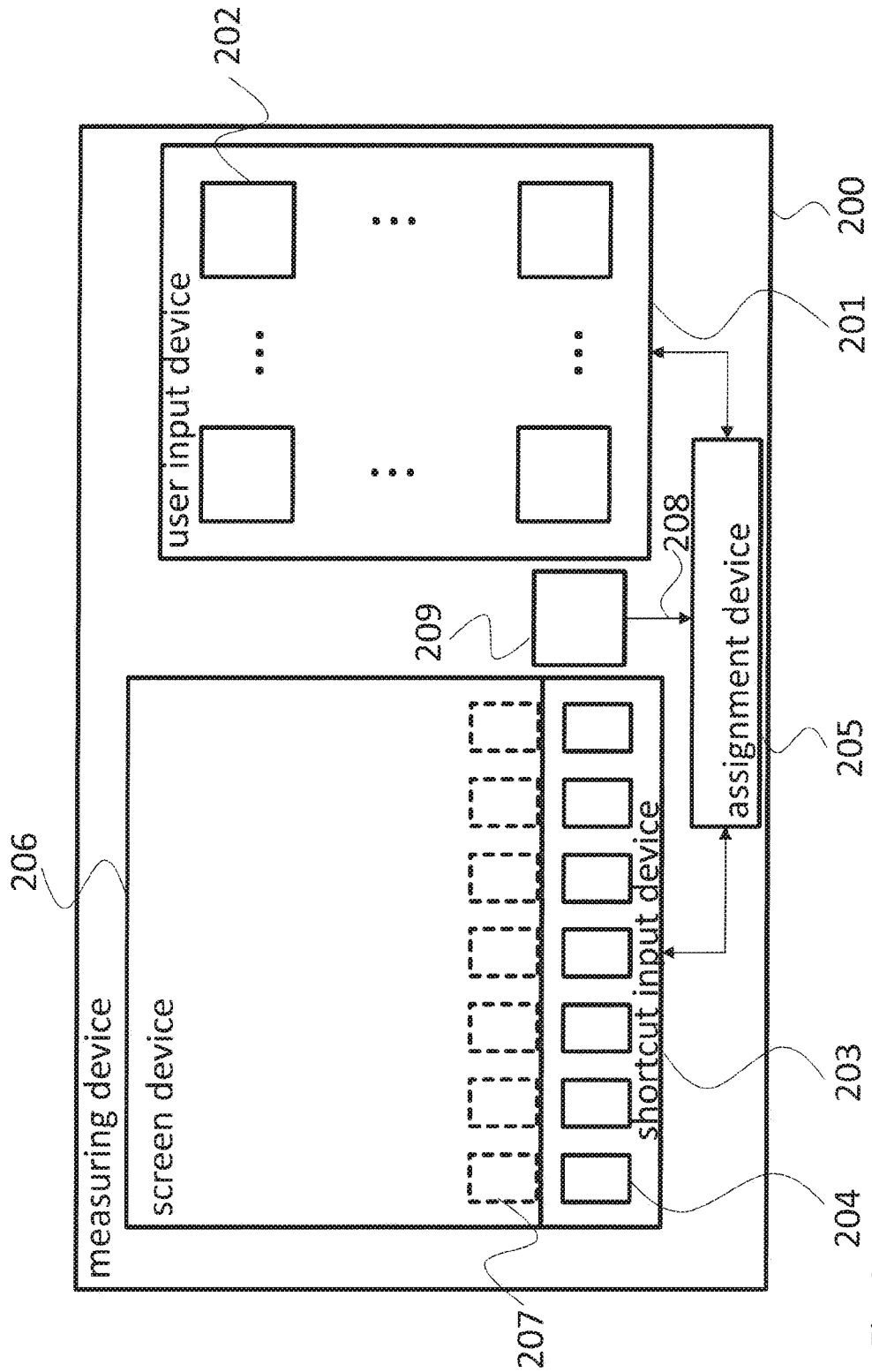
FIG. 2 shows a block diagram of another embodiment of a measuring device according to an embodiment of the present invention.

FIG. 2 shows a block diagram of another measuring device 200. The measuring device 200 is based on the measuring device 100. The user input device 201 is a dedicated or discrete user input device 201, which is exemplarily positioned right of a screen device 206. The shortcut input device 203 with the shortcut user inputs 204 is exemplarily positioned below the screen device 206. However, the shortcut input device 203 could also be positioned e.g. between the user input device 201 and the screen device 206 or left of the screen device 206.

To aid the user in finding the correct shortcut user input 204, the screen device 206 can show, either permanently or when requested by a user, indicators 207. The indicators 207 indicate to the user the respective first user inputs 202, to which the shortcut user inputs 204 refer. Such an indicator 207 can e.g. be a symbol or icon or a letter or the like.

The assignment device 205 is connected to an activation switch 209, which when activated by a user provides the user command 208 to the assignment device 205, which then initiates the assignment of a first user input 202 to a shortcut user input 204.

Figure 3:
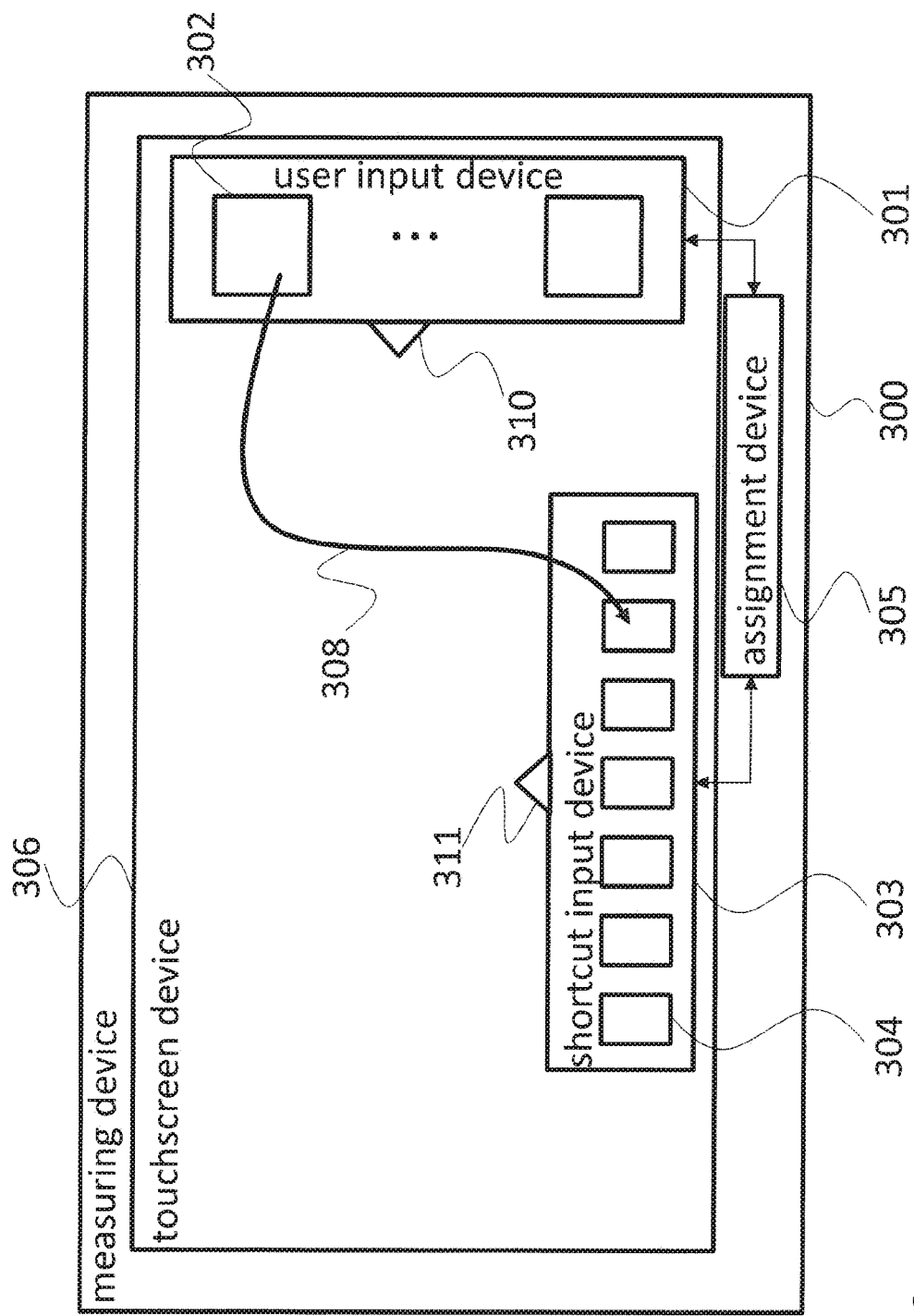
FIG. 3 shows a block diagram of another embodiment of a measuring device according to an embodiment of the present invention.

FIG. 3 shows a block diagram of another measuring device 300. With the measuring device 300 the user input device 301 and the shortcut input device 303 are both arranged on a screen device 306, which in this case is a touchscreen device.

The user input device 301 and the shortcut input device 303 are provided as virtual or visual devices 301, 303 on the touch screen device 306 as opposed to the discrete input devices in FIG. 2. It is understood, that the position of the user input device 301 and the shortcut input device 303 as shown in FIG. 3 is just exemplary and that the user input device 301 as well as the shortcut input device 303 can be positioned anywhere on the touchscreen device 306. Further, in one embodiment the user can drag and position the user input device 301 and the shortcut input device 303 on the touch screen device 306.

The user input device 301 and the shortcut input device 303 are both provided with arrow symbols 310, 311, which indicate that the user input device 301 and the shortcut input device 303 are retractable and can be hidden such that they do not cover other content of the touchscreen device 306. In the retracted stated e.g. only the arrow symbols 310, 311 can be visible on the respective border of the touchscreen device 306.

In contrast to the previously discussed measuring device 200, the measuring device 300 does not comprise a dedicated activation switch. Instead, the user can perform a drag gesture, which starts at one of the first user inputs 302 and ends at the respective shortcut user input 304.

The assignment device 305 detects the drag gesture on the touchscreen device 306, interprets the gesture as a respective user command 308 and consequently performs the assignment between the respective first user input 302 and the respective shortcut user input 304. It is understood however, that the assignment device 305 can also be provided with a dedicated activation switch nevertheless.

As already indicated the user input device 301 may comprise a layered navigation, i.e. a menu with different navigation levels. Each level can comprise at least one of the first user inputs 302 and/or at least a link to one subordinate navigation level. The measuring device 300 may e.g. be configured to show the respective navigation level in the user input device 301, when a user activates one of the shortcut user inputs 304.

Figure 4:
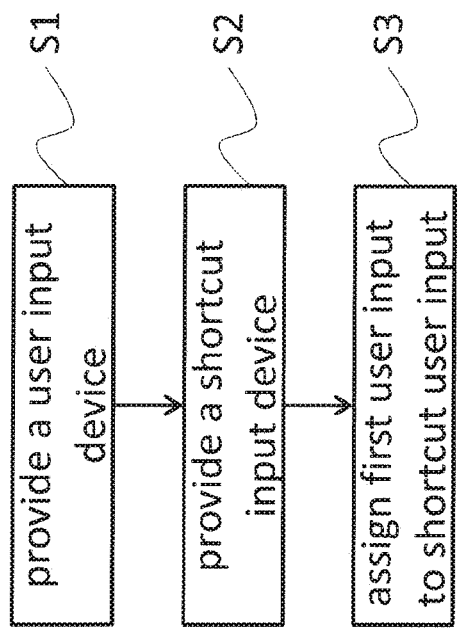
FIG. 4 shows a flow diagram of an embodiment of a configuration method according to an embodiment of the present invention.

FIG. 4 shows a flow diagram of a configuration method for a measuring device 100, 200, 300

The method comprises providing S1 a user input device 101, 201, 301 on the measuring device 100, 200, 300. The user input device 101, 201, 301 can e.g. be provided with a first number of first user inputs 102, 202, 302 for a user of the measuring device 100, 200, 300.

The method further comprises providing S2 a shortcut input device 103, 203, 303 on the measuring device 100, 200, 300. The shortcut input device 103, 203, 303 can e.g. be provided with a second number of shortcut user inputs 104, 204, 304 for the user.

Finally, the method also comprises assigning S3 a respective one of the first user inputs 102, 202, 302 to a respective one of the shortcut user inputs 104, 204, 304 based on a received user command 108, 208, 308.

Assigning implies that when the user activates one of the first user inputs 102, 202, 302 the measuring device 100, 200, 300 behaves as if the user had activated the respective one of the first user inputs 102, 202, 302.

If e.g. flexible positioning of the user input device 101, 201, 301 is required, the user input device 101, 201, 301 can e.g. be provided on a screen device 206, 306 and the first user inputs 102, 202, 302 can provided via an on screen display on the screen device 206, 306, which in this case would be a touchscreen device 306. With the screen device 206, 306, the user input device 101, 201, 301 can e.g. be hidden or retracted when it is not needed. If the screen device 206, 306 is not a touchscreen device, dedicated pushbuttons can e.g. be provided next to the screen device 206.

Further, since the content of the user input device 101, 201, 301 on the screen device 206, 306 can be flexibly changed, the on screen display can be provided with at least one navigation level and each navigation level can comprise at least one of the first user inputs 102, 202, 302 and/or at least one subordinate navigation level.

As an alternative, the user input device 101, 201, 301 can be provided as a hardware device, which comprises a plurality of discrete input devices.

Similarly, the shortcut input device 103, 203, 303 can be provided as a hardware device, which comprises a plurality of discrete input devices. The shortcut input device 103, 203, 303 can also be provided with a screen device 206, 306, which is arranged next to at least one of the discrete input devices and displays an indication of the respective first user input 102, 202, 302, which is assigned to the respective discrete input device.

As another embodiment, the shortcut input device 103, 203, 303 can also be provided with a touchscreen device 306 and the shortcut user inputs 104, 204, 304 can be provided via an on screen display on the touchscreen device 306. The same applies to the user input device 101, 201, 301.

Assigning S3 can e.g. comprise detecting a user command 108, 208, 308, especially the push of an activation switch 209, which initiates the assignment of one of the first user inputs 102, 202, 302 to one of the shortcut user inputs 104, 204, 304.

If a touchscreen device 306 is provided, the user command 108, 208, 308 can be detected as push of an icon on a touchscreen 306 device of the measuring device 100, 200, 300. Further, the user command 108, 208, 308 can also be detected as a drag gesture on the touchscreen device 306 of the measuring device 100, 200, 300 on one of the first user inputs 102, 202, 302.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300 measuring device
101, 201, 301 user input device
102, 202, 302 first user input
103, 203, 303 shortcut input device
104, 204, 304 shortcut user input
105, 205, 305 assignment device
206, 306 screen device
207 indicator
108, 208, 308 user command
209 activation switch
310, 311 arrow symbol
S1, S2, S3 method steps

The invention claimed is:

1. A measuring device comprising one or more processing units implemented in circuitry, the one or more processing units comprising a user input device, a shortcut input device and an assignment device, wherein:
the measuring device is configured to provide a plurality of measurement functions, which are configured by the user;
the measuring device comprises one of an oscilloscope and a network analyzer;
the user input device comprises a first number of first user inputs for a user of the measuring device to access measurement functions or configure the measuring device for a measurement task, wherein the user input device comprises a layered navigation including a menu with different navigation levels, each level comprises at least one of the first user inputs and/or at least one subordinate navigation level;
the shortcut input device comprises a second number of shortcut user inputs for the user, wherein the shortcut input device comprises a hardware device which comprises a plurality of discrete switches and/or buttons and/or rotary encoders; and
the assignment device is adapted to assign a respective first user input to a respective one of the shortcut user inputs based on a received user command, wherein the assignment device comprises a motion detector, which initiates an assignment of the one of the first user inputs to the respective one of the shortcut user inputs when the assignment device detects a drag gesture on a touchscreen device of the measuring device on one of the first user inputs, and the assignment device is adapted to assign a sequence of multiple first user inputs to a single shortcut user input,
wherein to assign a respective first user input to a respective one of the shortcut user inputs comprises assigning the respective first user input to a shortcut input device, such that a function of the respective first user input is performed when the respective one of the shortcut user inputs of the hardware device of the shortcut device is actuated by a user,
wherein the motion detector is adapted to automatically initiate the assignment if the drag gesture is longer than a distance threshold, and
wherein the first user inputs provide access to the plurality of measurement functions of the measuring device and the shortcut user inputs of the shortcut input device provide functions to the different navigation levels of the layered navigation of the first user inputs.

2. The measuring device of claim 1, wherein the user input device comprises a screen device and wherein the first user inputs are provided via an on screen display on the screen device.

3. The measuring device of claim 2,
wherein the user input device comprises a touchscreen device, and wherein the first user inputs are provided via an on screen display on the touchscreen device.

4. The measuring device of claim 1, wherein when one of the shortcut user inputs is activated the shortcut input device activates the assigned first user input.

5. The measuring device on claim 1, wherein the assignment device comprises an activation switch, which when pushed initiates the assignment of one of the first user inputs to one of the shortcut user inputs.

6. The measuring device of claim 5, wherein an activation switch is provided as an icon on a touchscreen device of the measuring device.

7. The measuring device of claim 1, wherein the assignment device assigns the first user input on which the drag gesture is detected, to the one of the shortcut user inputs, on which the drag gesture ends.

8. The measuring device of claim 1, wherein the assignment device creates a new shortcut user input, when it detects a drag gesture on a touchscreen device of the measuring device on one of the first user inputs, and/or wherein the assignment device removes the respective first user input, after assigning the first user input to one of the shortcut user inputs.

9. The measuring device of claim 1, wherein the user input device comprises a hardware device, which comprises a plurality of discrete input devices.

10. The measuring device of claim 1, wherein the shortcut input device comprises a screen device, which is arranged next to at least one of the hardware devices and displays an indication of the respective first user input, which is assigned to the respective hardware device.

11. A configuration method for a measuring device, wherein the measuring device is configured to provide a plurality of measuring functions, which are configured by the user, and wherein the measuring device comprises one of an oscilloscope and a network analyzer; the method comprising:
providing a user input device, which comprises a first number of first user inputs for a user of the measuring device to access measurement functions or configure the measuring device for a measurement task, wherein the user input device comprises a layered navigation including a menu with different navigation levels, each level comprises at least one of the first user inputs and/or at least one subordinate navigation level;
providing a shortcut input device, which comprises a second number of shortcut user inputs for the user, wherein the shortcut input device comprises a hardware device which comprises a plurality of discrete switches and/or buttons and/or rotary encoders; and
assigning a respective first user input to a respective one of the shortcut user inputs based on a received user command, wherein assigning comprises:
assigning the respective first user input to a shortcut input device, wherein the shortcut input device comprises a hardware device, such that a function of the respective first user input is performed when the respective one of the shortcut user inputs of the hardware device of the shortcut device is actuated by a user, and
initiating the assignment of the one of the first user inputs to the one of the shortcut user inputs, when a drag gesture is detected on a touchscreen device of the measuring device on one of the first user inputs, and the drag gesture is longer than a distance threshold, the assigning further comprises assigning a sequence of multiple first user inputs to a single shortcut user input;
wherein the first user inputs provide access to the plurality of measuring functions of the measuring device and the shortcut user inputs of the shortcut input device provide functions to the different navigation levels of the layered navigation of the first user inputs.

12. The configuration method of claim 11, wherein the user input device is provided on a screen device and wherein the first user inputs are provided via an on screen display on the screen device.

13. The configuration method of claim 12,
wherein the user input device is provided with a touchscreen device, and wherein the first user inputs are provided via an on screen display on the touchscreen device.

14. The configuration method of claim 11, wherein when one of the shortcut user inputs is activated the shortcut input device activates the assigned first user input.

15. The configuration method of claim 11, wherein assigning further comprises detecting the user command, especially the push of an activation switch, which initiates the assignment of one of the first user inputs to one of the shortcut user inputs.

16. The configuration method of claim 11, wherein the user command is detected as push of an icon on a touchscreen device of the measuring device.

17. The configuration method of claim 11, wherein assigning comprises assigning the first user input on which the drag gesture is detected to the one of the shortcut user inputs, on which the drag gesture ends.

18. The configuration method of claim 11, wherein assigning comprises creating a new shortcut user input, when a drag gesture on a touchscreen device of the measuring device on one of the first user inputs is detected, and/or
wherein assigning comprises removing the respective first user input, after assigning the first user input to one of the shortcut user inputs.

19. The configuration method of claim 11, wherein the user input device is provided as a hardware device, which comprises a plurality of discrete input devices.

20. The configuration method of claim 19, wherein the shortcut input device is provided with a screen device, which is arranged next to at least one of the hardware devices and displays an indication of the respective first user input, which is assigned to the respective hardware device.

* * * * *